(12) United States Patent
Parker et al.

(10) Patent No.: US 7,622,803 B2
(45) Date of Patent: Nov. 24, 2009

(54) HEAT SINK ASSEMBLY AND RELATED METHODS FOR SEMICONDUCTOR VACUUM PROCESSING SYSTEMS

(75) Inventors: Winston T. Parker, Raleigh, NC (US); Van Mieczowski, Apex, NC (US); Jim Wood, Raleigh, NC (US); Daniel Cronin, Raleigh, NC (US); David Emerson, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 176 days.

(21) Appl. No.: 11/467,040

(22) Filed: Aug. 24, 2006

(65) Prior Publication Data
US 2007/0047204 A1    Mar. 1, 2007

Related U.S. Application Data

(60) Provisional application No. 60/712,381, filed on Aug. 30, 2005.

(51) Int. Cl.
*H01L 23/10* (2006.01)
*H01L 21/00* (2006.01)
(52) U.S. Cl. .................. 257/706; 257/675; 257/720; 257/E23.051; 257/E23.075; 257/E23.087; 438/122
(58) Field of Classification Search ................ 257/706, 257/720, 675, E33.075, E23.051, E23.087; 438/122, FOR. 413
See application file for complete search history.

(56) References Cited

U.S. PATENT DOCUMENTS

| | | | | |
|---|---|---|---|---|
| 4,481,406 A | * | 11/1984 | Muka | 219/411 |
| 5,911,864 A | * | 6/1999 | Eldridge | 205/124 |
| 2006/0186909 A1 | * | 8/2006 | Aube et al. | 324/760 |
| 2007/0087483 A1 | * | 4/2007 | Yanase et al. | 438/125 |

FOREIGN PATENT DOCUMENTS

| DE | 10 2005 045 081 A1 | 4/2006 |
|---|---|---|
| EP | 1 000 915 A2 | 5/2000 |
| EP | 1 615 261 A1 | 1/2006 |
| WO | WO 2004/090967 A1 | 10/2004 |

OTHER PUBLICATIONS

Carter et al. "Applications for silicon carbide single crystal substrates" Accession No. 5131422 *Database Inspec; The Institution of Electrical Engineers* 1-2 (1994).
Invitation to Pay Additional Fees for PCT/US2006/033817; date of mailing Nov. 1, 2007.
International Search Report and Written Opinion for PCT/US2006/033817; date of mailing Apr. 5, 2007.

* cited by examiner

*Primary Examiner*—Long K Tran
(74) *Attorney, Agent, or Firm*—Myers Bigel Sibley & Sajovec

(57) ABSTRACT

An assembly for supporting a substrate during vacuum processing operations includes a thermally conductive heat sink tray including at least one wafer pocket recessed therein, and a thermally conductive heat sink carrier in the at least one wafer pocket. The heat sink carrier includes a first surface in contact with a surface within the at least one wafer pocket and a second surface opposite the first surface. A heat sink is affixed to the second surface of the heat sink carrier.

23 Claims, 5 Drawing Sheets

HEAT SINK ASSEMBLY AND RELATED METHODS FOR SEMICONDUCTOR VACUUM PROCESSING SYSTEMS

RELATED APPLICATION

This application claims the benefit of and priority to U.S. Provisional patent application No. 60/712,381, filed Aug. 30, 2005, the disclosure of which is hereby incorporated herein by reference as if set forth in its entirety.

FIELD OF THE INVENTION

The present invention relates to fabrication of semiconductor devices and materials, and in particular to vacuum processing of semiconductor devices and materials.

BACKGROUND

A number of semiconductor manufacturing processes involve processing of semiconductor materials at pressures below atmospheric pressure. For example, processes such as sputtering, evaporation, reactive ion etching (RIE), molecular beam epitaxy (MBE), chemical vapor deposition (CVD), and others may be advantageously performed in a vacuum chamber in which the pressure may be reduced to less than atmospheric pressure. As is known in the art, performing semiconductor processing in a vacuum chamber may provide an environment in which the mean free path (MFP) of particles in the system is large relative to the dimensions of the system and the materials being processed.

Semiconductor devices are typically fabricated on a substrate that provides mechanical support for the device and often participates in the electrical operation of the device as well. Silicon, germanium, gallium arsenide, gallium nitride, sapphire and silicon carbide are some of the materials commonly used as substrates for semiconductor devices. Many other materials, including semiconductor as well as non-semiconductor materials, may also be used as substrates for semiconductor devices. Semiconductor device manufacturing typically involves fabrication of many semiconductor devices on a single substrate.

Substrates are typically formed in the shape of circular wafers having a diameter ranging, for example, from less than 1 inch (about 25 mm) to over 12 inches (about 300 mm) depending on the type of material involved. Other shapes such as, for example, square, rectangular or triangular wafers are possible, however. Semiconductor devices are formed on the wafers by the precise formation of thin layers of semiconductor, insulator and metal materials that are deposited and patterned to form useful semiconductor devices such as diodes, transistors, solar cells and other devices.

In some cases, it may be desirable to maintain the substrate at or below a predetermined temperature during vacuum processing, as the temperature of the substrate may affect the processing that is being performed. For example, many properties of materials and processes may be affected by temperature, including reaction rates and diffusion rates, which typically follow a temperature-dependent Arrhenius relationship based on an activation energy constant. In other cases, it may be desirable to keep certain types of materials under a given temperature to avoid damage to sensitive materials and/or films. For example, photoresist and/or other polymeric materials may undesirably reflow at elevated temperatures.

Accordingly, it is known to cool substrates during vacuum processing. In typical cooling methods, a substrate is affixed to a heat sink which may be actively and/or passively cooled. Active cooling methods include, for example, fluid cooling circuits using water, helium gas, glycol, or another fluid with appropriate heat transfer characteristics. Passive cooling methods may employ a static thermal mass (e.g., a large piece of thermally conductive material such as copper) as the heat sink. Hybrid cooling methods may include, for example, a refrigerated static thermal mass for heat removal.

A conventional vacuum processing system is illustrated in FIG. 1. As shown therein, a conventional vacuum processing system may include a vacuum chamber 10 in which a number of substrates 12 are positioned. The substrates 12 may include, for example, silicon, germanium, gallium arsenide, sapphire and/or silicon carbide. The substrates 12 may include non-semiconductor materials such as metals and/or ceramics. The substrates 12 are positioned on a heat sink 14 which is supported by a submount 16. As discussed above, the heat sink 14 may be actively and/or passively cooled. The vacuum chamber 10 may include other features (not shown) for processing the substrates 12, such as, for example, an MBE source, input and exhaust gas lines, evaporation sources, sputter targets, plasma-generating electrodes, and/or other features. In some cases, the vacuum chamber 10 may be loadlocked. Thus, there may be no additional lines running from the heat sink 14 to a location external to the vacuum chamber 10.

Typically, the substrates 12 are affixed to the heat sink 14 by means of mechanical clamping, electrostatic clamping or some other clamping method. Physical clamping mechanisms may be undesirable, because they may break or otherwise damage delicate semiconductor wafers and/or films. Thus, in some systems, gravity may be used to hold the substrates 12 in place on the heat sink 14. However, it may be difficult to make uniform contact between the substrates 12 and the heat sink 14 using only gravity. Without adequate contact between the substrates 12 and the heat sink 14, hot spots may form in the substrates 12 which may adversely affect the substrates 12 and/or the processing of the substrates 12.

SUMMARY

An assembly for supporting a substrate during vacuum processing operations according to some embodiments of the invention includes a thermally conductive heat sink tray including at least one wafer pocket recessed therein, and a thermally conductive heat sink carrier in the at least one wafer pocket. The heat sink carrier includes a first surface in contact with a surface within the at least one wafer pocket and a second surface opposite the first surface. A heat sink is on the second surface of the heat sink carrier.

The heat sink may include a wafer of silicon carbide that has a flatness of about +/−20 µm or less. The heat sink may include a single crystal silicon carbide wafer and/or a wafer of macro-crystalline silicon carbide.

The heat sink carrier may include a protrusion extending from the first surface thereof, and the at least one wafer pocket may include a recess therein that may be shaped to matingly receive the protrusion extending from the heat sink carrier. The protrusion may include a cylindrical protrusion and/or an annular ring.

In some embodiments, the at least one wafer pocket may include a protrusion extending from a bottom surface thereof, and the heat sink carrier may include a recess therein that may be shaped to matingly receive the protrusion extending from the bottom surface of the wafer pocket.

The assembly may further include a cover plate disposed above the heat sink tray and including a plurality of openings therein, a respective one of openings being aligned with the at least one wafer pocket of the heat sink tray.

The heat sink tray may include a vent hole extending from a location within the at least one wafer pocket to an external surface of the heat sink tray. The heat sink tray may further include a hole extending from the at least one wafer pocket to a bottom surface of the heat sink tray and a fastener extending through the hole and attached to the heat sink carrier.

The assembly may further include a clamp affixed to the heat sink carrier and configured to urge a substrate into contact with the heat sink.

The assembly may further include a metallic bonding layer between the heat sink carrier and the heat sink. The metallic bonding layer may include indium.

A heat sink assembly for supporting a wafer during vacuum processing according to some embodiments of the invention includes a thermally conductive heat sink carrier and a heat sink affixed to the heat sink carrier.

Methods of vacuum processing a substrate according to some embodiments of the invention include mounting the substrate on a heat sink that is affixed to a heat sink carrier to form a heat sink assembly, placing the heat sink assembly in a wafer pocket of a heat sink tray including a plurality of wafer pockets, placing the heat sink tray in a vacuum chamber, and processing the substrate under a pressure less than an atmospheric pressure.

The methods may further include clamping a substrate to the heat sink using a mechanical clamp that may be configured to urge the substrate into contact with the heat sink.

In some embodiments, the methods may further include placing a cover plate including a plurality of openings therein over the heat sink tray, the cover plate including a plurality of openings therein that align with respective ones of the plurality of wafer pockets to thereby expose a portion of the substrate while maintaining the substrate in contact with the heat sink.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
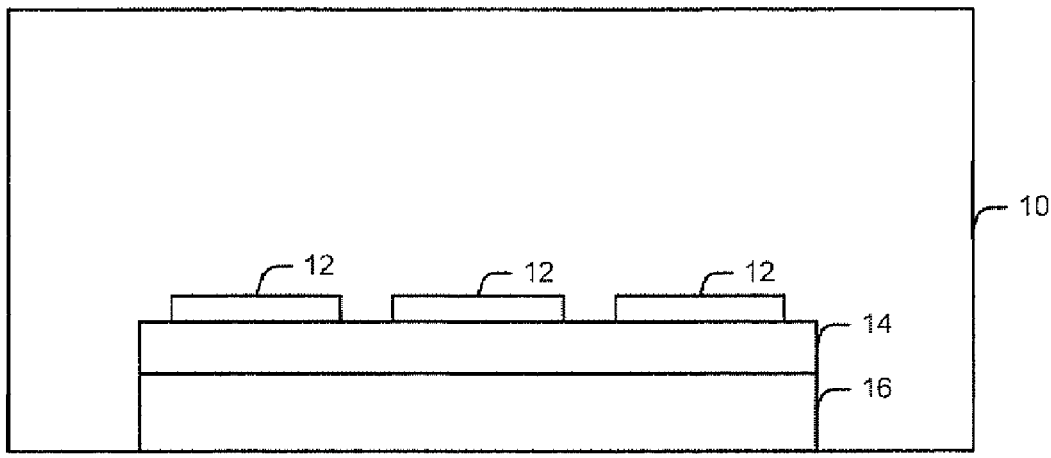
FIG. 1 is a schematic illustration of a conventional vacuum deposition system.

The present invention now will be described more fully hereinafter with reference to the accompanying drawings, in which embodiments of the invention are shown. This invention should not be construed as limited to the embodiments set forth herein; rather, these embodiments are provided so that this disclosure will be thorough and complete, and will fully convey the scope of the invention to those skilled in the art. Like numbers refer to like elements throughout. Furthermore, the various layers and regions illustrated in the figures are illustrated schematically. As will also be appreciated by those of skill in the art, while the present invention is described with respect to semiconductor wafers and diced chips, such chips may be diced into arbitrary sizes. Accordingly, the present invention is not limited to the relative size and spacing illustrated in the accompanying figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Figure 2:
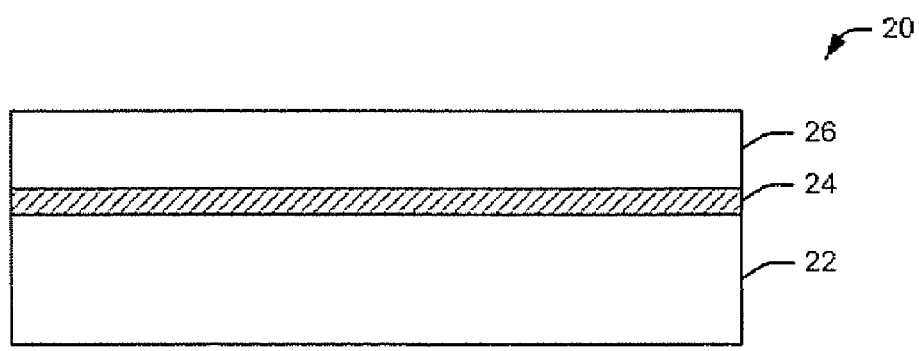
FIG. 2 is a schematic cross-section of a heat sink assembly according to embodiments of the invention.

A heat sink assembly 20 according to embodiments of the invention is illustrated in FIG. 2. The heat sink assembly 20 may be used to provide mechanical support and thermal management for one or more substrates in a vacuum processing system. The heat sink assembly 20 includes a heat sink carrier 22. A thermally conductive heat sink 26 may be bonded to the heat sink carrier 22 by means of an optional bonding layer 24. The heat sink carrier 22 may include a material having a high thermal conductivity, such as, for example, aluminum, copper, tin, stainless steel, etc.

The heat sink 26 may include a material having a high thermal conductivity and which may make a good contact to a substrate (not shown) placed thereon. In some embodiments, the heat sink 26 may include a disk of crystalline silicon carbide. In some cases, the heat sink 26 may include a disk of silicon carbide that is single crystalline. However, the heat sink 26 may not necessarily be single crystalline silicon carbide. For example, in some cases, the heat sink 26 may include polycrystalline silicon carbide or macro-crystalline silicon carbide (that is, polycrystalline silicon carbide including relatively large single crystalline grains). In particular, single crystalline and macro-crystalline silicon carbide may be machined to a high degree of flatness, and thus may be capable of making uniform contact with a substrate placed thereon. In some embodiments, a silicon carbide heat sink 26 may be polished to a flatness of +/−20 µm or less. Silicon carbide is also very hard and durable, and is compatible with vacuum processing. In addition, silicon carbide can withstand elevated process temperatures, does not readily degrade, and may be manufactured with low impurities.

The heat sink 26 may be bonded to the heat sink carrier 22 by an optional bonding layer 24, which, in some embodiments, is a metallic bonding layer. In particular embodiments, the bonding layer 24 may include a layer of indium. Indium bonding is known in the art, and has been used, for example, for attaching a sputter target to a backing plate. The bonding layer 24 may provide a thermal and/or mechanical connection between the heat sink carrier 22 and the heat sink 26.

Figure 3:
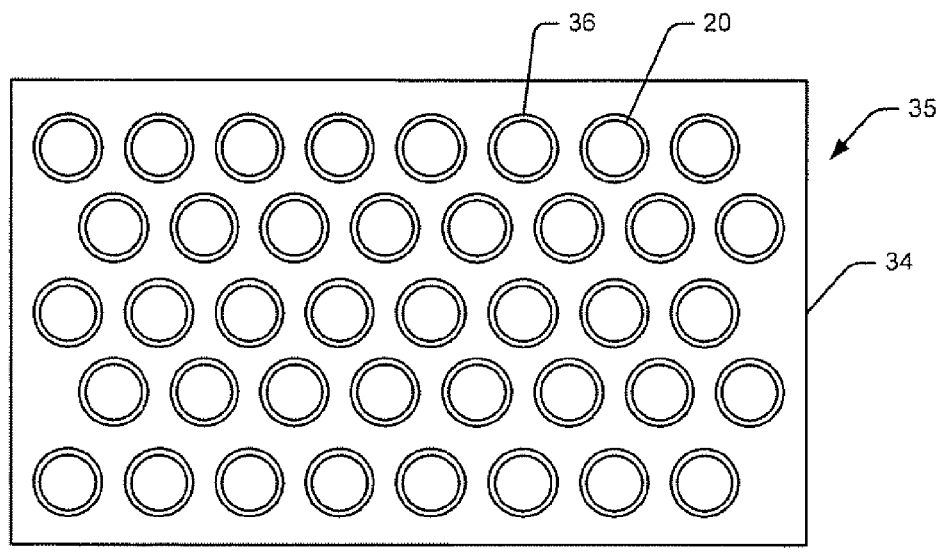
FIG. 3 is a top view of a heat sink tray assembly according to embodiments of the invention.

A heat sink tray assembly 35 is illustrated schematically in plan view in FIG. 3. As shown therein, a heat sink tray assembly 35 includes a heat sink tray 34. The heat sink tray 34 may include a plurality of wafer pockets 36 into which individual heat sink assemblies 20 are placed. The heat sink tray 34 may include a solid block into which the wafer pockets 36 may be formed, for example by milling. The heat sink tray 34 may include aluminum or any other suitable material. In addition, the heat sink tray 34 may include additional features (not shown) to permit automated handling, such as, for example, automated loading and/or unloading of the heat sink tray assembly 35 to/from a vacuum processing chamber.

Figure 4:
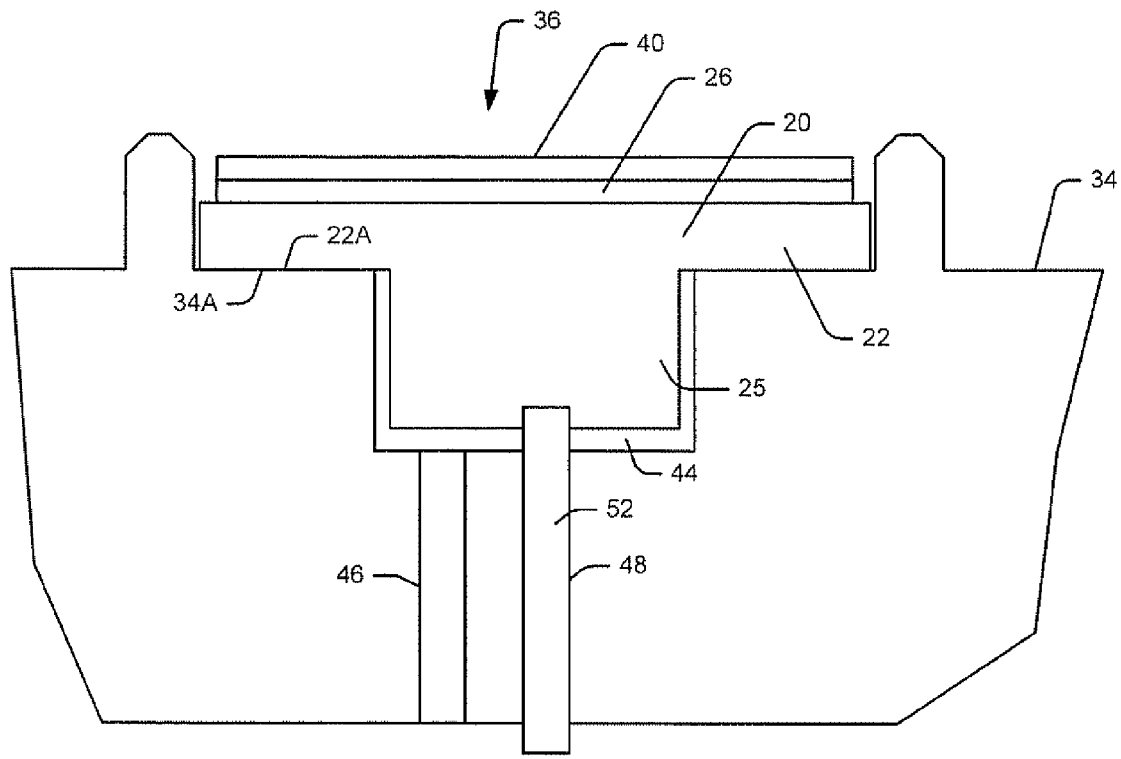
FIG. 4 is a schematic cross section of a portion of a heat sink tray assembly according to embodiments of the invention.

Referring to the embodiments of FIG. 4, a wafer pocket 36 of the heat sink tray 34 is shown in partial cross section. The heat sink tray 34 may include a heat sink assembly 20 inserted therein. As illustrated in FIG. 4, the wafer pocket 36 may include a recess 44 in the bottom surface thereof for matingly receiving a protruding feature 25 on the back of the heat sink carrier 22. The protruding feature 25 on the back of the heat sink carrier 22 and the recess 44 in the wafer pocket 36 may cooperate to permit the heat sink assembly 20 to be easily inserted into and removed from the wafer pocket 36. While a single protruding feature 25 is shown in FIG. 4, the heat sink carrier 22 may include more than one protruding feature 25.

In addition, the heat sink tray 34 may include one or more holes 48 extending therethrough beneath the wafer pockets 36 to permit the heat sink assembly 20 to be affixed to the heat sink tray 34 using one or more fasteners 52 which may extend through the holes 48. The heat sink tray 34 may additionally include one or more vent holes 46 that extend from the interior of the wafer pocket 36 to an external surface of the heat sink tray 34 to equalize pressure between the wafer pocket and the processing chamber in which the heat sink tray 34 is placed.

As further illustrated in FIG. 4, a substrate 40 is placed on the heat sink 26, and the entire heat sink assembly 20 with the substrate 40 thereon is placed into a wafer pocket 36, such that at least one surface of the heat sink carrier 22 is in contact with a surface of the heat sink tray 34. In particular, a bottom surface 22A of the heat sink carrier 22 may be in direct contact with a corresponding surface 34A of the heat sink tray 34 within the wafer pocket 36.

Figure 5:
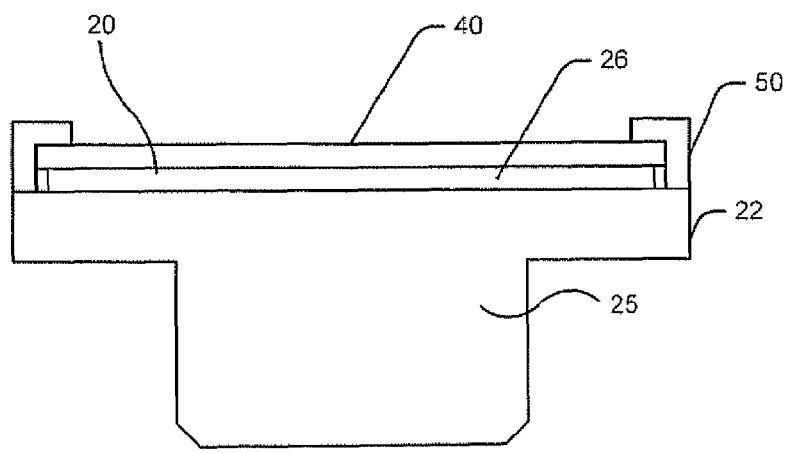
FIG. 5 is a schematic cross-section of a heat sink assembly according to further embodiments of the invention.

In the embodiments illustrated in FIG. 4, the substrate 40 is held in place on the heat sink assembly 20 by gravity. However, in some embodiments, such as the embodiments illustrated in FIG. 5, the substrate 40 may be affixed to the heat sink assembly 20 by means of a mechanical clamp 50. As further illustrated in FIG. 5, the corners of the protruding feature 25 of the heat sink carrier 25 may be chamfered or otherwise shaped to simplify insertion of the heat sink assembly 20 into the wafer pocket 36.

Figure 6:
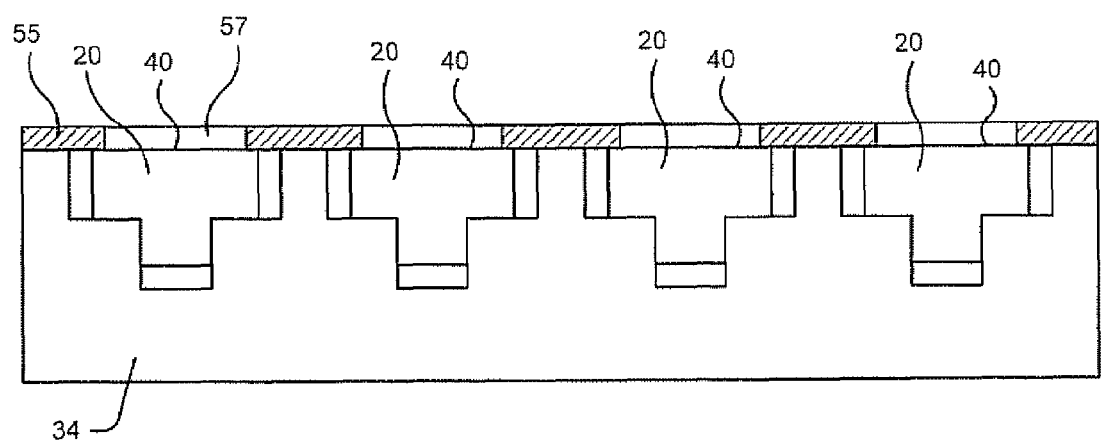
FIG. 6 is a schematic cross-section of a heat sink tray including a plurality of heat sink assemblies according to some embodiments of the invention.

Referring to FIG. 6, in some embodiments of the invention, the wafers 40 may be affixed to the heat sink assemblies 20 by means of a cover plate 55 that may be placed over the heat sink assemblies 20 after they have been inserted into the heat sink tray 34. The cover plate 55 may include a plurality of openings 57 that align with the heat sink assemblies 20 to expose the wafers 40 thereon. The cover plate 55 may be formed, for example, of graphite, silicon carbide, quartz, or any other suitable material.

A bonded heat sink assembly 20 according to embodiments of the invention may be used with any vacuum processing apparatus, including vacuum processing apparatus having a heat source (or which otherwise heats during operation) and/or in which it is otherwise desirable to control the temperature of the wafer being processed. In particular, a bonded heat sink assembly 20 according to embodiments of the invention may be used in a sputter vacuum apparatus.

A bonded heat sink assembly 20 according to embodiments of the invention includes a heat sink 26 of a material that is appropriate to contact the substrate 40 being processed. In some embodiments, a silicon carbide disk having a flatness of +/−20 µm or less may withstand processing conditions without unacceptable degradation.

Figure 7A:
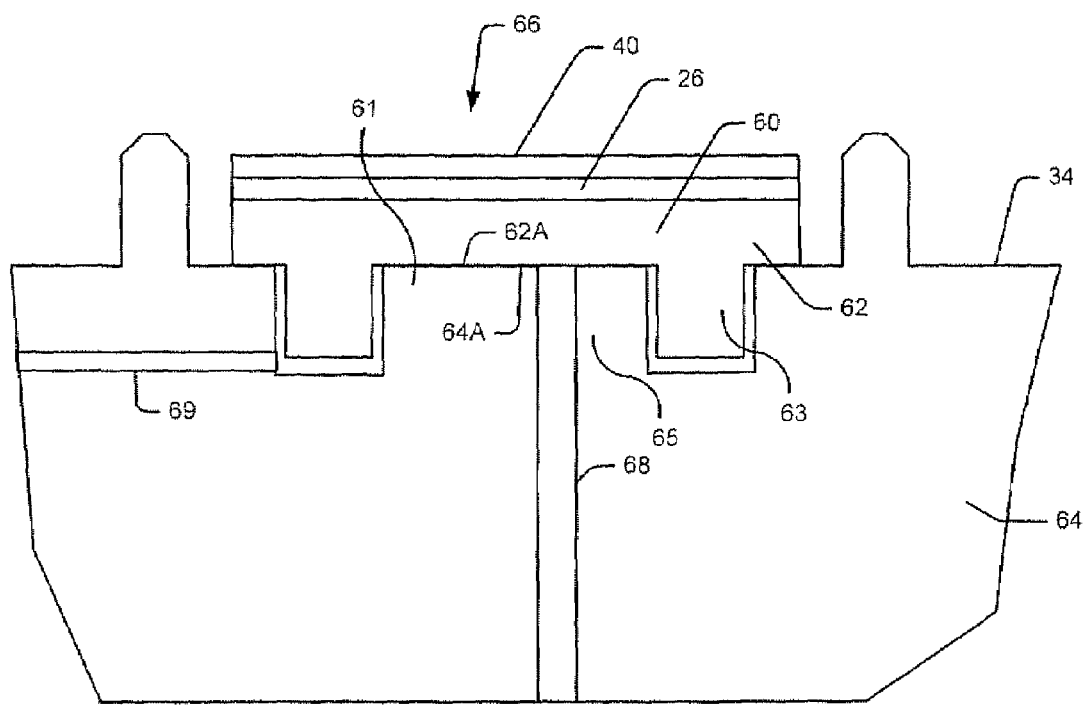
FIG. 7A is a schematic cross section of a portion of a heat sink tray assembly according to further embodiments of the invention.
Figure 7B:
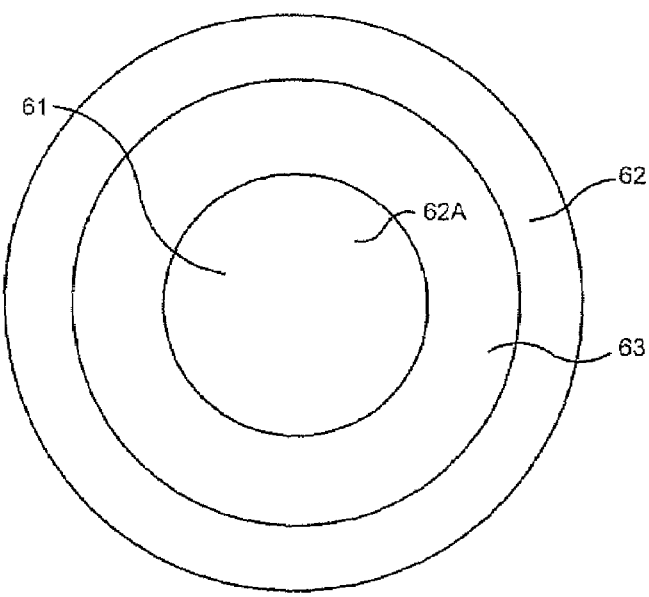
FIG. 7B is a bottom view of a heat sink assembly as shown in FIG. 7A.

A heat sink assembly 60, including a heat sink carrier 62 and a heat sink 26, and heat sink tray 64 according to further embodiments of the invention are illustrated in FIGS. 7A-B. As shown therein, a wafer pocket 66 of the heat sink tray 64 is shown in partial cross section including a heat sink assembly 60 inserted therein. In the embodiments illustrated in FIG. 7A, the heat sink carrier 62 may include a recess 61 that is configured to matingly receive a protrusion 65 from the floor of the wafer pocket 66 when the heat sink assembly 60 is inserted into the wafer pocket 66. In addition, the heat sink tray 64 may include one or more holes 68 extending therethrough beneath the wafer pockets 66 to permit the heat sink assembly 60 to be affixed to the heat sink tray 64 using fasteners (not shown) which may extend through the holes 68. The heat sink tray 64 may additionally include one or more vent holes 69 to reduce leaks to vacuum from gas trapped in the cavity between the heat sink carrier 60 and the heat sink tray 64. As shown in FIG. 7A, the vent hole 69 may extend from a location within the wafer pocket 66 to an external surface of the heat sink tray 64 and may extend, for example, in a lateral direction as shown. Alternatively, the vent hole may extend in a vertical direction as shown in FIG. 4.

A heat sink carrier 62 is shown in bottom view in FIG. 7B. Referring to FIGS. 7A-B, the heat sink carrier 62 may include an annular ring 63 that protrudes from a bottom surface 62A of the heat sink carrier 62 and defines the recess 61.

Figure 8:
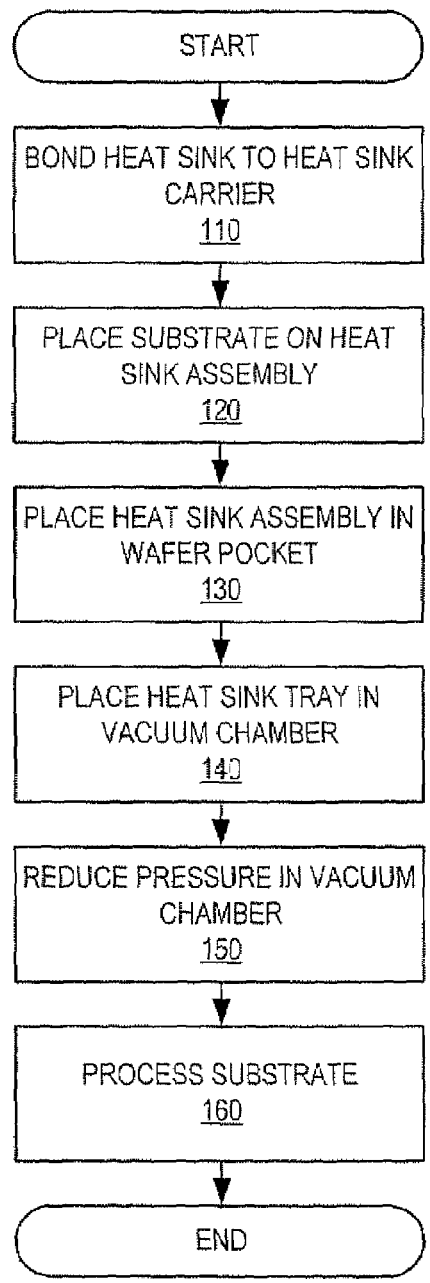
FIG. 8 is a flowchart illustrating operations according to some embodiments of the invention.

Referring to FIG. 8, methods according to embodiments of the invention are illustrated. The methods include bonding a heat sink 26 to a heat sink carrier 22162 to form a heat sink assembly 20/60 (block 110). A substrate 40 is placed on the heat sink assembly 20/60 (block 120), and the heat sink assembly 20/60 and substrate 40 are placed in a wafer pocket 36/66 of a heat sink tray 34/64 (block 130). The heat sink tray 34/64 including one or more heat sink assemblies 20/60 is placed in a vacuum chamber (block 140), and the pressure in the vacuum chamber is reduced (block 150). The substrate 40 may then be processed under a pressure less than an atmospheric pressure (block 160).

Methods according to embodiments of the invention may be employed in any vacuum process, including processes employing or having a heat source. Methods according to particular embodiments of the invention may be utilized in conjunction with a sputter process.

In some methods and/or apparatus according to embodiments of the invention, the wafers 40 may be held in place on the heat sink assemblies 20/60 by gravity. In some methods and/or apparatus according to embodiments of the invention, the wafers 40 may be held in place on the heat sink assemblies 20/60 by mechanical clamps 50 or other means.

Methods according to some embodiments of the invention may be utilized in conjunction with automated processing equipment in which vacuum processing is performed at least in part. Embodiments of the invention may be particularly applicable for automated processes in which cooling is desirable. Methods in which a plurality of wafers 40 are handled on a single heat sink tray 34/64 may be particularly suited for automated processing of large volumes of wafers 40. Furthermore, methods according to embodiments of the invention may be particularly useful in vacuum processing systems that employ a load lock that isolates the wafers from the environment outside a vacuum chamber.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. An assembly for supporting a substrate during vacuum processing operations, comprising:
   a thermally conductive heat sink tray including at least one wafer pocket recessed therein;
   a thermally conductive heat sink carrier in the at least one wafer pocket, the heat sink carrier including a first surface in contact with a surface within the at least one wafer pocket and a second surface opposite the first surface; and
   a heat sink on the second surface of the heat sink carrier.

2. The assembly of claim 1, wherein the heat sink comprises a wafer of silicon carbide that has a flatness of about +/−20 μm or less.

3. The assembly of claim 2, wherein the heat sink comprises a single crystal silicon carbide wafer.

4. The assembly of claim 2, wherein the heat sink comprises a wafer of macro-crystalline silicon carbide.

5. The assembly of claim 1, wherein the heat sink carrier comprises a protrusion extending from the first surface thereof, and wherein the at least one wafer pocket includes a recess therein that is shaped to receive the protrusion extending from the heat sink carrier.

6. The assembly of claim 5, wherein the protrusion comprises a cylindrical protrusion.

7. The assembly of claim 5, wherein the protrusion comprises an annular ring.

8. The assembly of claim 1, wherein the at least one wafer pocket comprises a protrusion extending from a bottom surface thereof, and wherein the heat sink carrier includes a recess therein that is shaped to receive the protrusion extending from the bottom surface of the wafer pocket.

9. The assembly of claim 1, further comprising a cover plate disposed above the heat sink tray and including a plurality of openings therein, a respective one of openings being aligned with the at least one wafer pocket of the heat sink tray.

10. The assembly of claim 1, wherein the heat sink tray comprises a vent hole extending from a location within the at least one wafer pocket to an external surface of the heat sink tray.

11. The assembly of claim 1, wherein the heat sink tray comprises a hole extending from the at least one wafer pocket to a bottom surface of the heat sink tray and a fastener extending through the hole and attached to the heat sink carrier.

12. The assembly of claim 1, further comprising a clamp affixed to the heat sink carrier and configured to urge a substrate into contact with the heat sink.

13. The assembly of claim 1, further comprising a metallic bonding layer between the heat sink carrier and the heat sink.

14. The assembly of claim 13, wherein the metallic bonding layer comprises indium.

15. A heat sink assembly for supporting a wafer during vacuum processing, comprising:
   a thermally conductive heat sink carrier;
   a heat sink affixed to the heat sink carrier, wherein the heat sink has a flatness of about +/−20 μm or less; and
   a metallic bonding layer between the heat sink carrier and the heat sink.

16. The heat sink assembly of claim 15, wherein the heat sink comprises a wafer of silicon carbide.

17. The heat sink assembly of claim 16, wherein the heat sink comprises a single crystal silicon carbide wafer.

18. The heat sink assembly of claim 16, wherein the heat sink comprises a wafer of macro-crystalline silicon carbide.

19. The heat sink assembly of claim 15, wherein the heat sink carrier comprises a protrusion extending from the first surface thereof.

20. The heat sink assembly of claim 19, wherein the protrusion comprises a cylindrical protrusion.

21. The heat sink assembly of claim 19, wherein the protrusion comprises an annular ring.

22. The heat sink assembly of claim 15, wherein the metallic bonding layer comprises indium.

23. The heat sink assembly of claim 15, further comprising a clamp affixed to the heat sink carrier and configured to urge a substrate into contact with the heat sink.

* * * * *

UNITED STATES PATENT AND TRADEMARK OFFICE
CERTIFICATE OF CORRECTION

PATENT NO.       : 7,622,803 B2                          Page 1 of 1
APPLICATION NO.  : 11/467040
DATED            : November 24, 2009
INVENTOR(S)      : Winston T. Parker et al.

It is certified that error appears in the above-identified patent and that said Letters Patent is hereby corrected as shown below:

On the Title page,

[*] Notice:    Subject to any disclaimer, the term of this patent is extended or adjusted under
               35 U.S.C. 154(b) by 176 days.

Delete the phrase "by 176 days" and insert -- by 268 days --

Signed and Sealed this

Twenty-fourth Day of August, 2010

David J. Kappos
*Director of the United States Patent and Trademark Office*

UNITED STATES PATENT AND TRADEMARK OFFICE
CERTIFICATE OF CORRECTION

PATENT NO. : 7,622,803 B2
APPLICATION NO. : 11/467040
DATED : November 24, 2009
INVENTOR(S) : Parker et al.

It is certified that error appears in the above-identified patent and that said Letters Patent is hereby corrected as shown below:

In the Claims:

Column 8, Claim 19, Line 52: Please correct "from the first" to read -- from a --

Signed and Sealed this

Twelfth Day of October, 2010

David J. Kappos
*Director of the United States Patent and Trademark Office*